(12) United States Patent
Lee

(10) Patent No.: US 12,176,913 B2
(45) Date of Patent: Dec. 24, 2024

(54) ANALOG-TO-DIGITAL CONVERTER CAPABLE OF QUICK CONVERSION

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 208 days.

(21) Appl. No.: 18/073,197

(22) Filed: Dec. 1, 2022

(65) Prior Publication Data

US 2023/0283289 A1     Sep. 7, 2023

(30) Foreign Application Priority Data

Mar. 4, 2022   (KR) .................. 10-2022-0028018

(51) Int. Cl.
*H03M 1/38*     (2006.01)
*H03M 1/12*     (2006.01)
*H03M 1/66*     (2006.01)

(52) U.S. Cl.
CPC ............... *H03M 1/38* (2013.01); *H03M 1/12* (2013.01); *H03M 1/66* (2013.01)

(58) Field of Classification Search
CPC ............ H03M 1/38; H03M 1/42; H03M 1/66; H03M 1/12
USPC .................................. 341/161, 155, 144, 157
See application file for complete search history.

(56) References Cited

U.S. PATENT DOCUMENTS 9,337,811 B1 *   5/2016   Kris ........................ G05B 11/16
2015/0015229 A1 *  1/2015  Teh ........................ H02M 3/157
                                                                 323/284

* cited by examiner

*Primary Examiner* — Peguy Jean Pierre
(74) *Attorney, Agent, or Firm* — KILE PARK REED & HOUTTEMAN PLLC

(57) ABSTRACT

An analog-to-digital converter may comprise a code voltage generating part that generates a conversion code voltage according to the conversion digital code; a voltage comparing part that generates a comparison result signal by comparing the input analog voltage and the conversion code voltage; a shifting register that receives a clock signal and generates a 1-st to a n-th control pulse signals; and a code generating part that generates the conversion digital code with receiving by comparison result signal and the 1-st to the n-th control pulse signals.

14 Claims, 11 Drawing Sheets

ANALOG-TO-DIGITAL CONVERTER CAPABLE OF QUICK CONVERSION

CROSS-REFERENCE TO RELATED APPLICATION

This application claims priority to and the benefit of Korean Patent Application No. 2022-0028018 under 35 U.S.C. 119, filed on Mar. 4, 2022, the disclosure of which is incorporated herein by reference in its entirety.

BACKGROUND

1. Technical Field

The disclosure relates to an electronic circuit, and more particularly, to an analog-to-digital converter for converting an analog voltage into a digital code.

2. Discussion of Related Art

The analog-to-digital converter is a circuit that converts a level of an analog signal into a digital code, and is widely used for interface circuits in semiconductor memory devices and the like. The analog-to-digital converter converts the signal of the analog component into data of the digital component, and loss of information that may occur during signal transmission can be reduced.

On the other hand, semiconductor memory devices in recent years have been speeding up. Accordingly, it is necessary that the conversion of the analog voltage to the digital code is also performed quickly.

For such a speedy conversion, an analog-to-digital converter having a successive approach is developed. In the analog-to-digital converter having a successive approach, digital-to-analog conversion is repeatedly performed to generate a conversion code voltage according to the digital code. Then, the voltage signal is compared with the conversion code voltage, and data values of the digital code bits are determined.

However, in the conventional analog-to-digital converter, the level of the conversion code voltage is sequentially converted from the highest value or the lowest value according to the clock generation of the clock signal. If the digital code is composed of 4 bits, in the worst case, the number of clocks of the clock signal required to determine the digital code is 15.

As a result, in the conventional analog-to-digital converter, it takes a considerable amount of time to convert an analog signal voltage into a digital code.

SUMMARY

The disclosure is directed to an analog-to-digital converter in which analog voltage to digital code conversion can be performed quickly.

According to an aspect of the disclosure, there is provided an analog-to-digital converter for converting an input analog voltage to a conversion digital code.

The analog-to-digital converter according to the disclosure may comprise a code voltage generating part that generates a conversion code voltage according to the conversion digital code, wherein the conversion code voltage is an analog type voltage, the conversion digital code is consisted of a 1-st to a n-th conversion digital bits, the 1-st to the n-th conversion digital bits are in order from a most significant bit to a least significant bit; and "n" is a natural number equal to or greater than 2, a voltage comparing part that generates a comparison result signal by comparing the input analog voltage and the conversion code voltage, a logic state of the comparison result signal being based on the result of the comparison of the input analog voltage and the conversion code voltage; a shifting register that receives a clock signal and generates a 1-st to a n-th control pulse signals, the 1-st to the n-th control pulse signals being sequentially activated without overlapping; and a code generating part that generates the conversion digital code by receiving the comparison result signal and the 1-st to the n-th control pulse signals, a logic state of the i-th conversion digital bit being based on a logic state of the comparison result signal during an activation of an i-th control pulse signal, and "I" being a natural number in a range of 1 to n.

The 1-st conversion digital bit may be controlled to a first logic state according to an activation of a reset signal, and the 2-nd to n-th conversion digital bits may be controlled to a second logic state according to an activation of the reset signal, the second logic state being opposite to the first logic state.

The code voltage generating part may include a resistor string that generates 1-st to p-th division voltages, wherein the 1-st to p-th division voltages may be obtained by dividing a voltage difference between a power voltage and a ground voltage with a 1-st to a (p-1)-th division voltage resistors formed in series between the power voltage and the ground voltage, and p may be 2 to the power of n; and a selection part that generates the conversion code voltage, the conversion code voltage being controlled to the same level as any one of the 1-st to the p-th division voltages selected according to the conversion digital code.

The comparison result signal may be controlled to a first logic state as the input analog voltage is lower than the conversion code voltage, and the comparison result signal may be controlled to a second logic state as the input analog voltage is higher than the conversion code voltage, the second logic state being opposite to first logic state.

The 1-st control pulse signal may be controlled to an activated state according to an activation of a reset signal, and the 2-nd to n-th control pulse signals may be controlled to an inactivated state according to an inactivation of the reset signal.

The shifting register may include 1-st to n-th flip-flops that generates the 1-st to the n-th control pulse signals, the 1-st flip-flop may be enabled according to an inactivation of the reset signal, latch a ground voltage according to an inactivation of the clock signal, and control the 1-st control pulse signal to a logic state of the latched ground voltage according to an inactivation of the clock signal, and the j-th flip-flop may be enabled according to an inactivation of the reset signal, latch a (j−1)-th control pulse signal according to an activation of the clock signal, and control the j-th control pulse signal to a logic state of (j−1)-th control pulse signal according to an inactivation of the clock signal, "j" being a natural number in a range of 2 to n.

The 1-st flip-flop may include a 1-st input flop part that is enabled according to an inactivation of the reset signal, receives a ground voltage, and generates a 1-st input flop signal, the 1-st input flop signal being latched to a logic state opposite to a state of the ground voltage in response to an activation of the clock signal and being latched to the first logic state in response to an activation of the reset signal; and a 1-st output flop part that is enabled according to an inactivation of the reset signal, receives the 1-st input flop signal, and generates the 1-st control pulse signal, the 1-st control pulse signal being latched to a logic state opposite to a state of the 1-st input flop signal in response to an inactivation of the clock signal and being latched to the second logic state in response to an activation of the reset signal.

The j-th flip-flop may include a j-th input flop part that is enabled according to an inactivation of the reset signal, receives the (j−1)-th control pulse signal, and generates a j-th input flop signal, the j-th input flop signal being latched to a logic state opposite to a state of the (j−1)-th control pulse signal in response to an activation of the clock signal and being latched to the second logic state in response to an activation of the reset signal; and a j-th output flop part that is enabled according to an inactivation of the reset signal, receives the j-th input flop signal, and generates the j-th control pulse signal, the j-th control pulse signal being latched to a logic state opposite to a state of the j-th input flop signal in response to an inactivation of the clock signal and being latched to the first logic state in response to an activation of the reset signal.

The 1-st conversion digital bit may be controlled to a first logic state according to an activation of a reset signal, and the 2-nd to n-th conversion digital bits may be controlled to a second logic state according to an activation of the reset signal, the second logic state being opposite to the first logic state.

The i-th conversion digital bit may be controlled to the first logic state according to an activation of the reset signal, and controlled to the logic state based on the logic state of the comparison result signal according to an inactivation of the j-th control pulse signal.

The code generating part may include 1-st to n-th code generating parts that generate 1-st to n-th conversion digital bits, respectively.

The 1-st code generating part may include a 1-st input code part that is enabled according to an inactivation of the reset signal, latches the comparison result signal in response to an activation of the 1-st control pulse signal, and generates a 1-st input code signal, the 1-st input code signal having the same logic state as the comparison result signal and being controlled to the first logic state in response to an activation of the reset signal; and a 1-st output code part that generates the 1-st conversion digital bit by using the 1-st code signal according to an inactivation of the 1-st control pulse signal.

The j-th code generating part may include a j-th input code part that is enabled according to an inactivation of the reset signal, latches the comparison result signal in response to an activation of a j-th control pulse signal, and generates a j-th input code signal, the j-th input code signal having the same logic state as the comparison result signal and being controlled to the second logic state in response to an activation of the clock signal; and a j-th output code part that generates a j-th conversion digital bit by using a j-th code signal according to an inactivation of the j-th control pulse signal, j being a natural number in a range of 2 to n.

The voltage comparing part may further include a comparing part that generates a comparison preliminary signal by receiving the comparison result signal and the 1-st to the n-th control pulse signals, and a buffering part that generates the comparison result signal by receiving the comparison preliminary signal.

BRIEF DESCRIPTION OF THE DRAWINGS

The above and other objects, features and advantages of the disclosure will become more apparent to those skilled in the art by describing in detail exemplary embodiments thereof with reference to the accompanying drawings, in which.

DETAILED DESCRIPTION OF EMBODIMENTS

Figure 1:
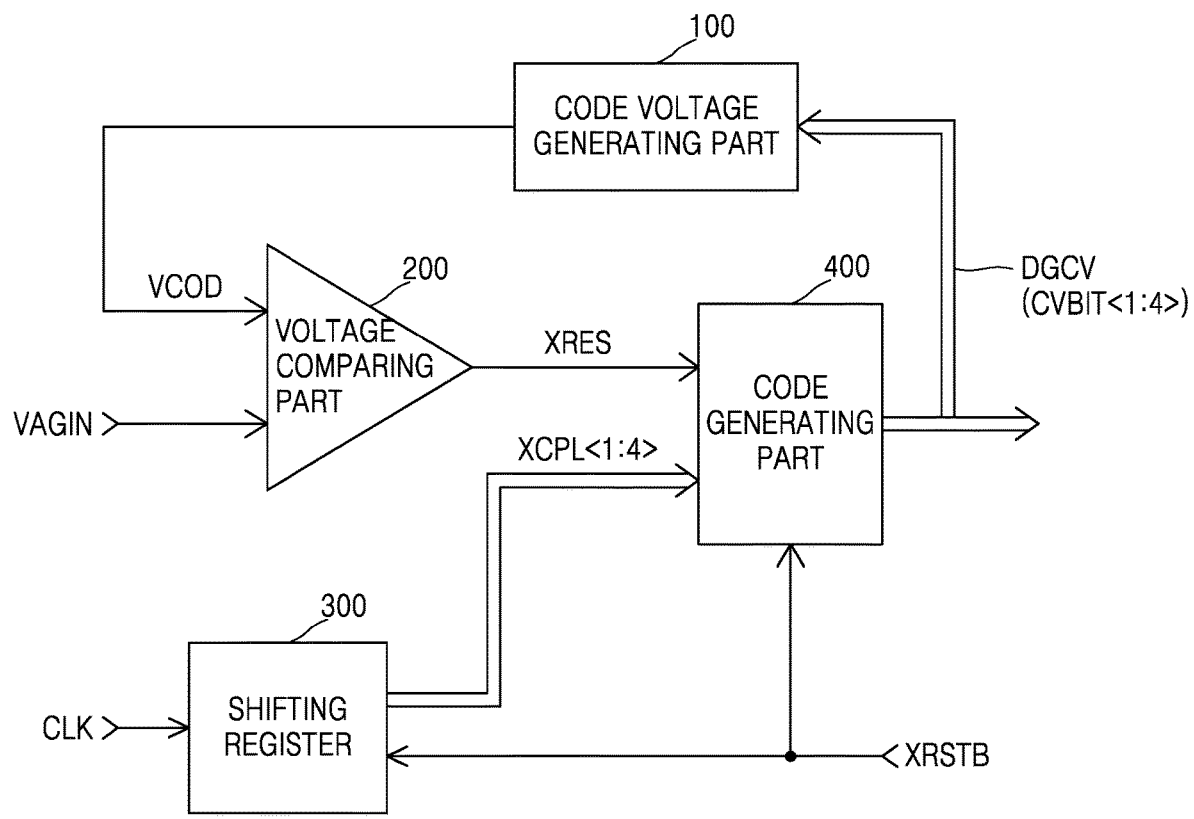
FIG. 1 is a diagram schematically illustrating an analog-to-digital converter according to an embodiment of the disclosure.

Embodiments of the disclosure will be described in detail below with reference to the accompanying drawings. While the disclosure is shown and described in connection with exemplary embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting of the disclosure. As used herein, the singular forms (e.g., "a" and "an") are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

FIG. 1 is a diagram illustrating an analog-to-digital converter according to an embodiment of the disclosure, and shows an analog-to-digital converter that receives an input analog voltage VAGIN and converts it into a conversion digital code DGCV.

Referring to FIG. 1, the analog-to-digital converter according to the disclosure may include a code voltage generating part 100, a voltage comparing part 200, a shifting register 300 and a code generating part 400.

The code voltage generating part 100 may generate a conversion code voltage VCOD according to the conversion digital code DGCV. The conversion code voltage VCOD may be an analog type voltage. The conversion digital code DGCV may include or consist of n conversion digital bits CVBIT. Here, "n" may be a natural number equal to or greater than 2. In this specification, "n" may be assumed as "4" for convenience of description.

For example, the conversion digital code DGCV may include or consist of a 1-st to a 4-th conversion digital bits CVBIT<1:4>. Here, the 1-st to the 4-th conversion digital bits CVBIT<1:4> may be in order from the most significant bit to the least significant bit. For example, the bit furthest to the left may be the most significant bit and the bit furthest to the right may be the least significant bit. However, the embodiments are not limited thereto.

Figure 2:
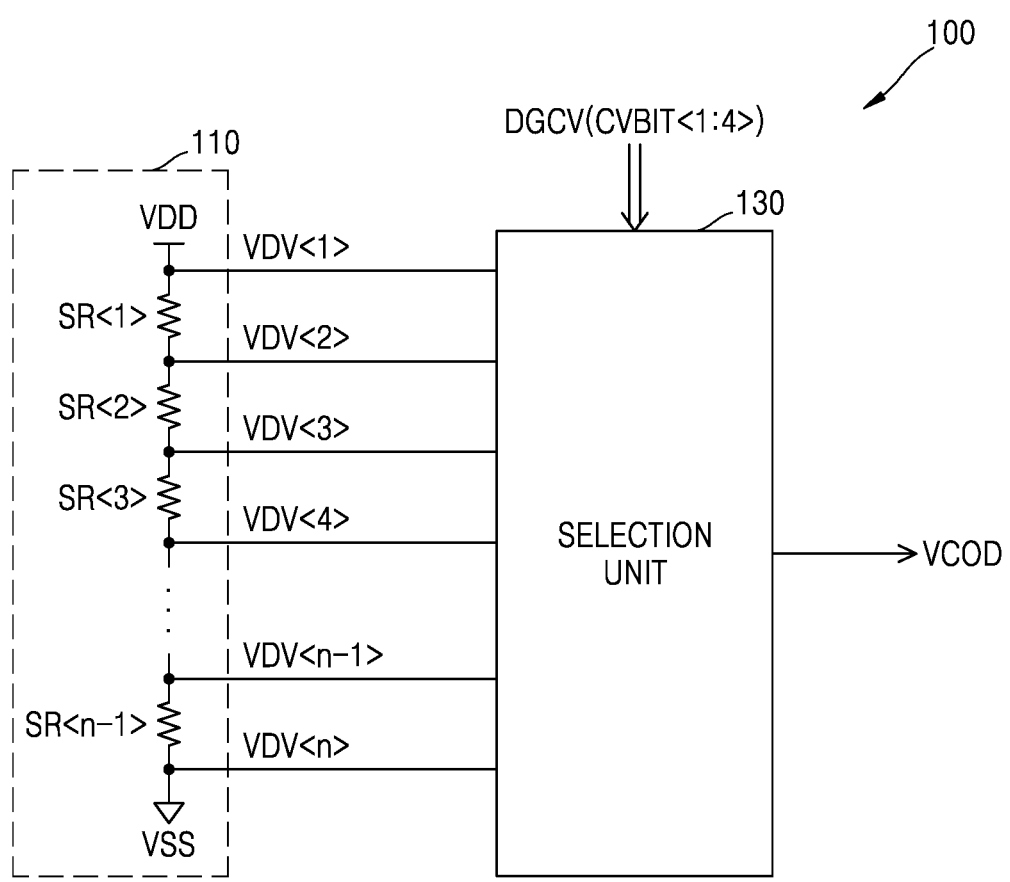
FIG. 2 is a detailed drawing schematically illustrating a code voltage generating part of FIG. 1.

FIG. 2 is a drawing illustrating a code voltage generating part 100 of FIG. 1. Referring to FIG. 2, the code voltage generating part 100 may include a resistor string 110 and a selection unit 130.

The resistor string 110 may generate p division voltages DVD. Here, p may be 2 to the power of n. In this embodiment, "p" is "16" since "n" assumed as "4."

For example, the resistor string 110 may generate a 1-st to 16-th division voltages DVD<1> to DVD<16>. The 1-st to the 16-th division voltages DVD<1> to DVD<16> may be obtained by dividing a voltage difference between a power voltage obtained by dividing a voltage difference between a power voltage VDD and a ground voltage VSS with a 1-st to a 15-th division voltage resistors SR<1> to SR<15>. The 1-st to the 15-th division voltage resistors SR<1> to SR<15> may be formed in series between the power voltage VDD and the ground voltage VSS.

In this specification, for simplicity of explanation, the detailed description of the configuration and operation of the resistor string 110 is simplified or omitted.

The selection unit (or selection part) 130 may generate the conversion code voltage VCOD. The conversion code voltage VCOD may be controlled to be at the same level as any one of the 1-st to the 16-th division voltages VDV<1> to VDV<16>, which may be selected according to the conversion digital code.

In this specification, for simplicity of explanation, the detailed description of the configuration and operation of the selection unit 130 is simplified or omitted.

Referring again to FIG. 1, the voltage comparing part 200 may generate a comparison result signal XRES with comparing the input analog voltage VAGIN and the conversion code voltage VCOD. The logic state of the comparison result signal XRES may be based on the result of the comparison of the input analog voltage VAGIN and the conversion code voltage VCOD.

Figure 3:
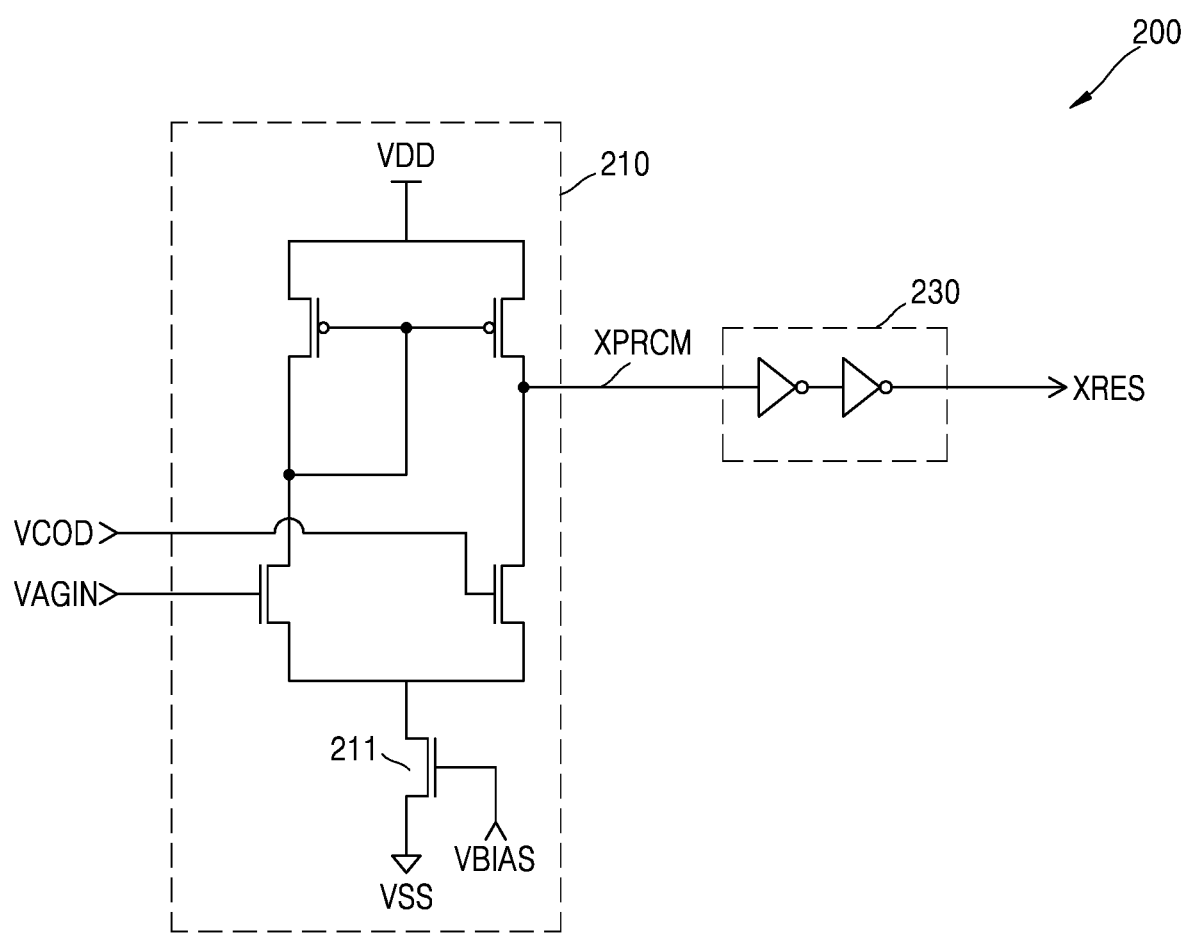
FIG. 3 is a diagram illustrating a voltage comparing part of FIG. 1.

FIG. 3 is a diagram illustrating the voltage comparing part 200 of FIG. 1. Referring to FIG. 3, the voltage comparing part 200 may include a comparing unit (or comparing part) 210 and a buffering unit (or buffering part) 230.

The comparing unit 210 may generate a comparison preliminary signal XPRCM with comparing the input analog voltage VAGIN and the conversion code voltage VCOD. The comparison preliminary signal XPRCM may be controlled toward the ground voltage VSS as the level of the input analog voltage VAGIN may be lower than that of the conversion code voltage VCOD. The comparison preliminary signal XPRCM may be controlled toward the power voltage VDD as the level of the input analog voltage VAGIN may be higher than that of the conversion code voltage VCOD.

For example, in the comparing unit 210, the NMOS transistor 211 may act as a current source.

The buffering unit 230 may buffer the comparison preliminary signal XPRCM to generate the comparison result signal XRES.

Accordingly, the comparison result signal XRES may be controlled to be at "L" (which may be referred to as a "first logic state") as the level of the input analog voltage VAGIN may be lower than that of the conversion code voltage VCOD. The comparison result signal XRES may be controlled to "H" (which may be referred to as a "second logic state") as the level of the input analog voltage VAGIN is higher than that of the conversion code voltage VCOD.

Referring again to FIG. 1, the shifting register 300 may receive a clock signal CLK and generate a 1-st to a 4-th control pulse signals XCPL<1:4>. The 1-st to the 4-th control pulse signals XCPL<1:4> may be sequentially activated without overlapping.

Figure 4:
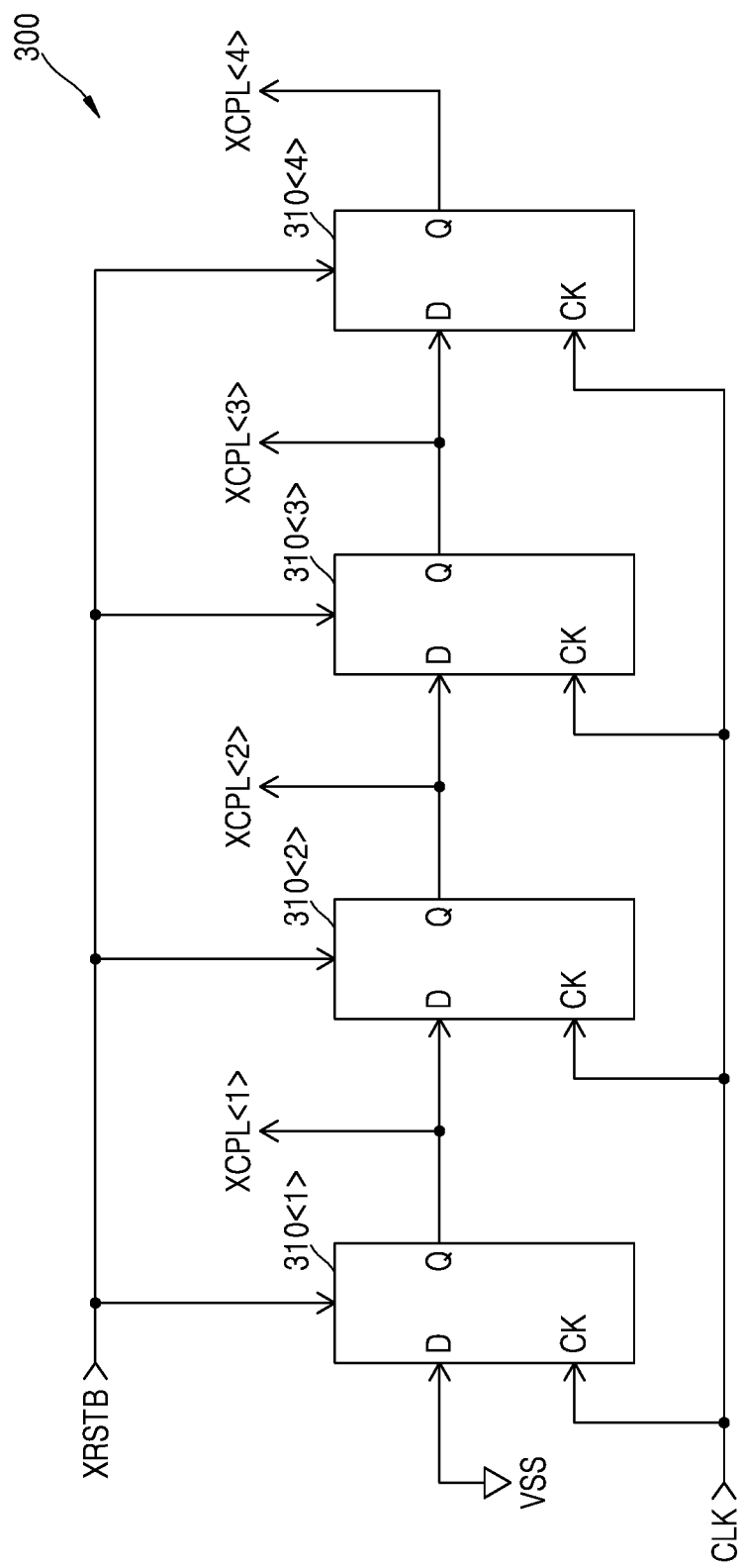
FIG. 4 is a diagram illustrating a shifting register of FIG. 1.

FIG. 4 is a diagram illustrating a shifting register 300 of FIG. 1. Referring to FIG. 4, the shifting register 300 may include a 1-st to a 4-th flip-flops 310<1:4> to generate the 1-st to the 4-th control pulse signals XCPL<1:4>.

The 1-st flip-flop 310<1> may be enabled according to the inactivation of a reset signal XRSTB. The 1-st control pulse signal XCPL<1> may be controlled to the activation state, for example, in the second state of "H," according to the activation of "L" of the reset signal XRSTB. The j-th (here, "j" is a natural number in a range of 2 to 4) control pulse signal XCPL<j> may be controlled to the inactivation state, for example, in the first state of "H," according to the activation of "L" of the reset signal XRSTB.

Figure 5:
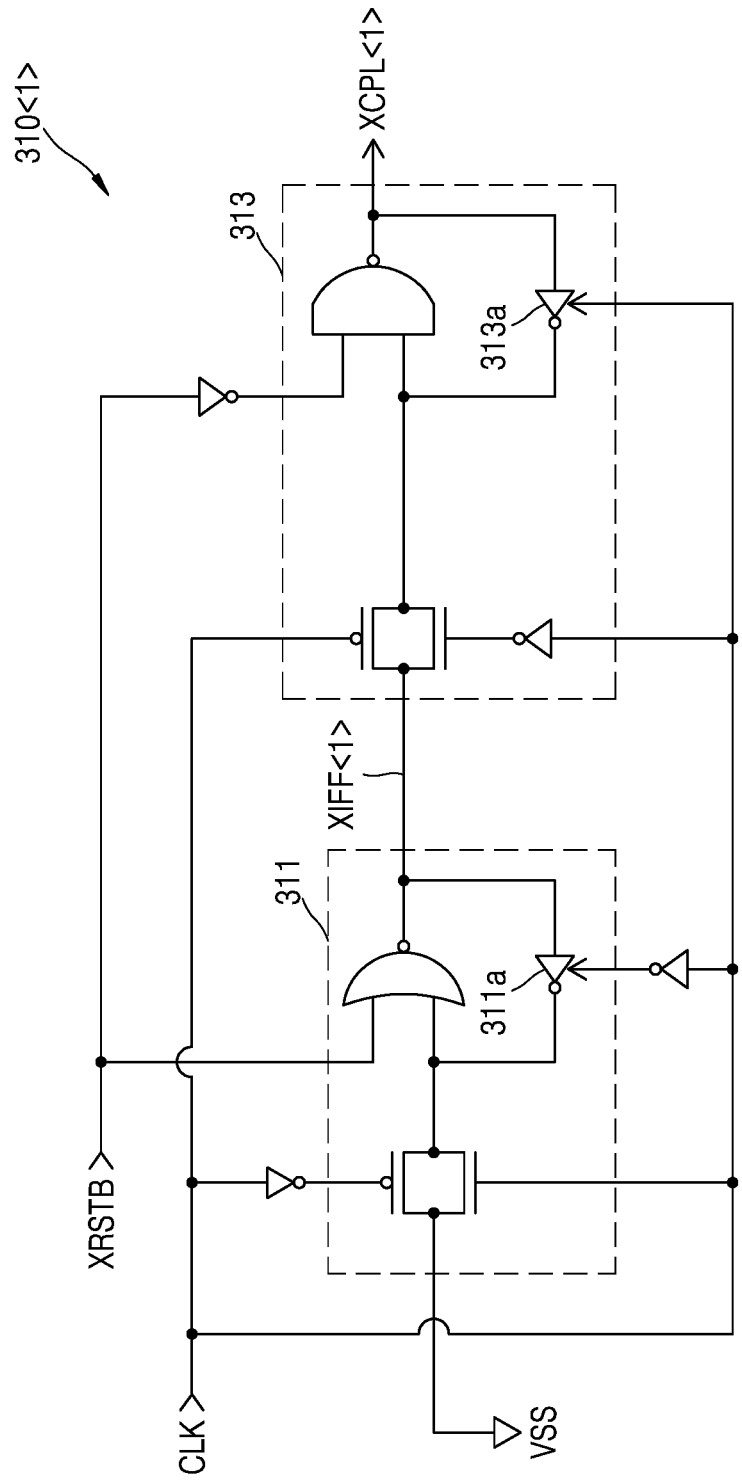
FIG. 5 is a more detailed diagram illustrating a 1-st flip flop of FIG. 4.

FIG. 5 is a more detailed diagram illustrating the 1-st flip flop 310<1> of FIG. 4. Referring to FIG. 5, the 1-st flip flop 310<1> may include a 1-st input flop unit (or 1-st input flop part) 311 and a 1-st output flop unit (or 1-st output flop part) 313.

The 1-st input flop unit 311 may be enabled according to the inactivation of "H" of the reset signal XRSRB. The 1-st input flop unit 311 may receive the ground voltage VSS and generate a 1-st input flop signal XIFF<1>. The 1-st input flop signal XIFF<1> may be latched to the logic state opposite to the state of the ground voltage VSS in response to the activation of "H" of the clock signal CLK, and latched to the first logic state of "L" in response to the activation of "L" of the reset signal XRSTB. For example, an inverter 311a in the 1-st input flop unit 311 may be enabled in case that the clock signal CLK is inactivated.

The 1-st output flop unit 313 may be enabled according to the inactivation of "H" of the reset signal XRSTB. The 1-st output flop unit 313 may receive the 1-st input flop signal XIFF<1> and generate the 1-st control pulse signal XCPL<1>. The 1-st control pulse signal XCPL<1> may be latched to the logic state opposite to the state of the 1-st input flop signal XIFF<1> in response to the inactivation of "L" of the clock signal CLK, and latched to the second logic state of "H" in response to the activation of "L" of the reset signal XRSTB. For example, an inverter 313a in the 1-st output flop unit 313 may be enabled in case that the clock signal CLK is activated.

According to the 1-st flip flop 310<1> of FIG. 5 as described above, the 1-st control pulse signal XCPL<1> may be latched to the second logic state of "H" in response to the activation of "L" of the reset signal XRSTB. The 1-st control pulse signal XCPL<1> may be latched to the logic state of the ground voltage VSS, that is "L" according to the clock generation of the clock signal CLK.

Figure 6:
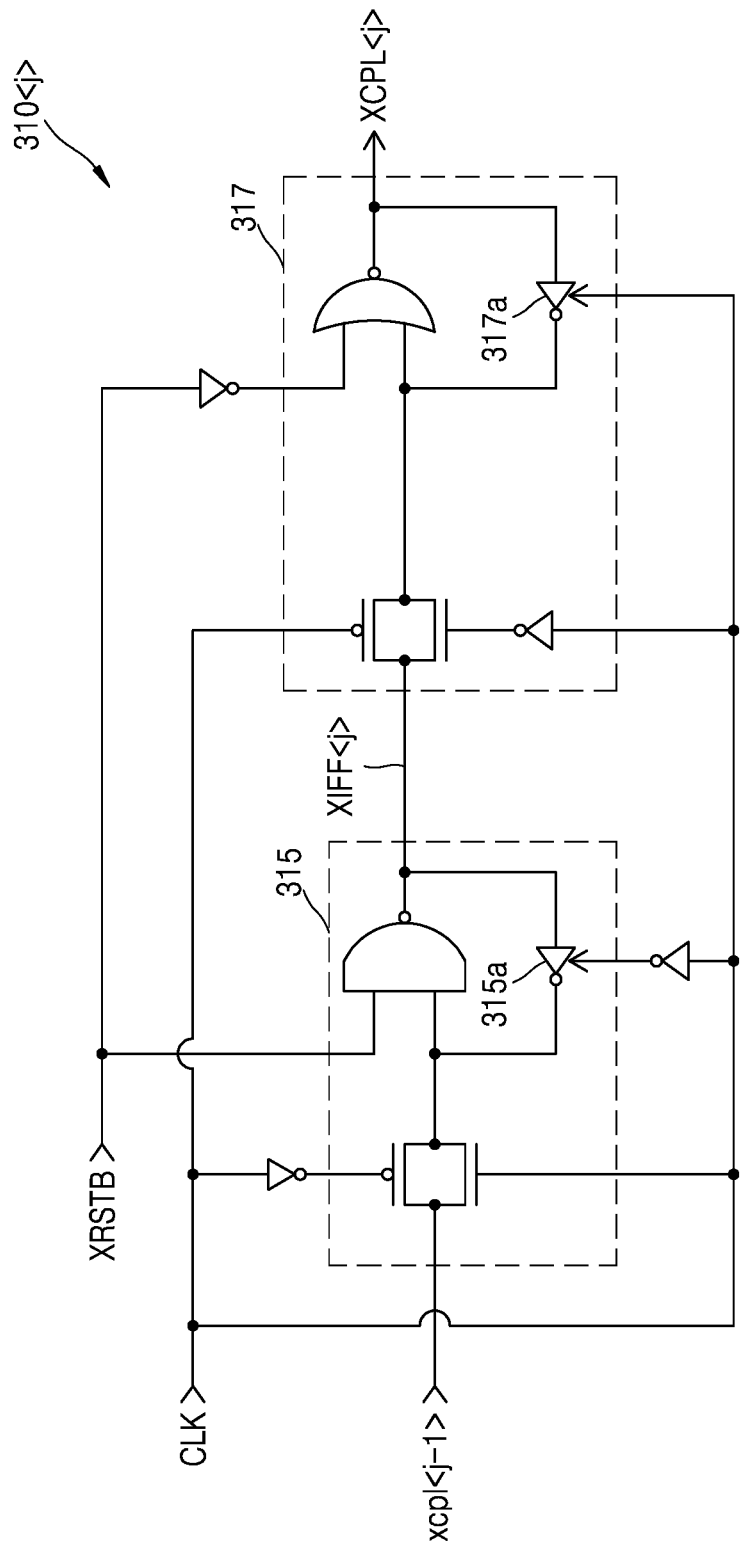
FIG. 6 is a more detailed diagram illustrating any one of a 2-nd to a 4-th flip flop of FIG. 4.

FIG. 6 is a more detailed diagram illustrating any one of a 2-nd to a 4-th flip flop 310<2> to 310<4> of FIG. 4. In FIG. 6, a j-th flip flop 310<j> is illustrated as an example. Here, "j" is a natural number in a range of 2 to 4.

Referring to FIG. 6, the j-the flip flop 310<j> may include a j-th input flop unit 315 and a j-th output flop unit 317.

The j-th input flop unit 315 may be enabled according to the inactivation of "H" of the reset signal XRSRB. The j-th input flop unit 315 may receive (j−1)-th control pulse signal XCPL<j−1> and generate a j-th input flop signal XIFF<j>. The j-th input flop signal XIFF<j> may be latched to the logic state opposite to the state of the (j−1)-th control pulse signal XCPL<j−1> in response to the activation of "H" of the clock signal CLK, and latched to the second logic state of "H" in response to the activation of "L" of the reset signal XRSTB. For example, an inverter 315a in the j-the input flop unit 315 may be enabled in case that the clock signal CLK is inactivated.

The j-th output flop unit 317 may be enabled according to the inactivation of "H" of the reset signal XRSTB. The j-th output flop unit 317 may receive the j-th input flop signal XIFF<j> and generate the j-th control pulse signal XCPL<j>. The j-th control pulse signal XCPL<j> may be latched to the logic state opposite to the state of the j-th input flop signal XIFF<j> in response to the inactivation of "L" of the clock signal CLK, and latched to the first logic state of "L" in response to the activation of "L" of the reset signal XRSTB. For example, an inverter 317a in the j-the output flop unit 317 may be enabled in case that the clock signal CLK is activated.

According to the j-th flip flop 310<j> of FIG. 6 as described above, the j-th control pulse signal XCPL<j> may be latched to the first logic state of "L" in response to the activation of "L" of the reset signal XRSTB. The j-th control pulse signal XCPL<j> may be latched to the logic state of the (j-)-th control pulse signal XCPL<j−1> according to the activation of the clock signal CLK.

Figure 10:
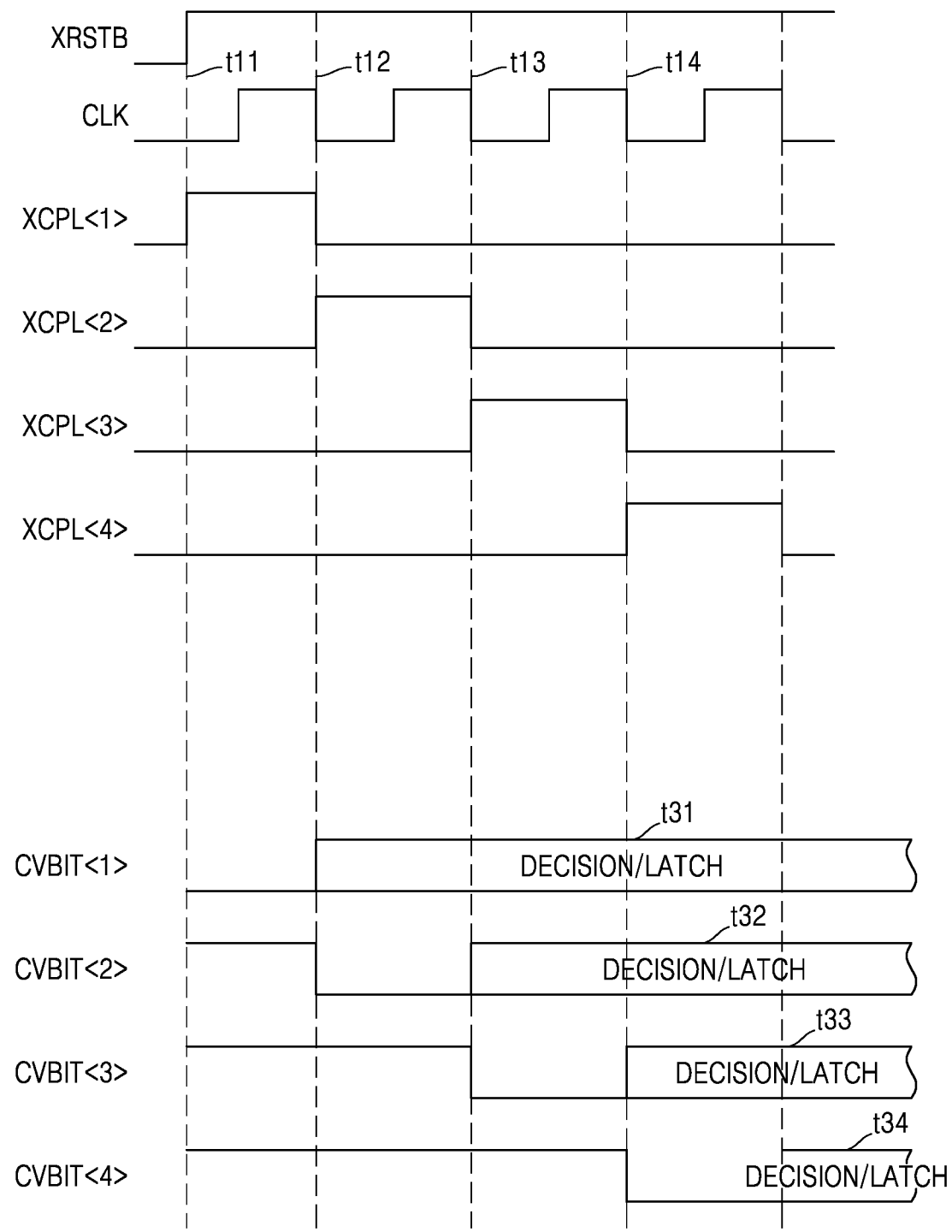
FIG. 10 is a timing diagram of main signals in the analog-to-digital converter of FIG. 1.

As a result, according to the shifting register 300 of FIG. 4 as described above, in response to the activation of "L" of the reset signal XRSTB, the 1-st control pulse signal XCPL<1> may be controlled to the second logic state of "H," and the 2-nd to the 4-th control pulse signal XCPL<2:4> may be controlled to the first logic state of "L". Refer to t1 of FIG. 10.

The 2-nd to the 4-th control pulse signal XCPL<2:4> may be sequentially controlled to the second logic state of "H" according to the clock generation of the clock signal CLK. Refer to t12, t13 and t14 of FIG. 10.

Referring again to FIG. 1, the code generating part 400 may receive the comparison result signal XRES and the 1-st to the 4-th control pulse signal XCPL<1:4>, and generate the 1-st to the 4-th conversion digital bit CVBIT<1:4> in the conversion digital code DGCV. The i-th conversion digital bit CVBIT<i> may be based on the logic state of the comparison result signal XRES during the activation of the i-th control pulse signal XCPL<i>.

Figure 7:
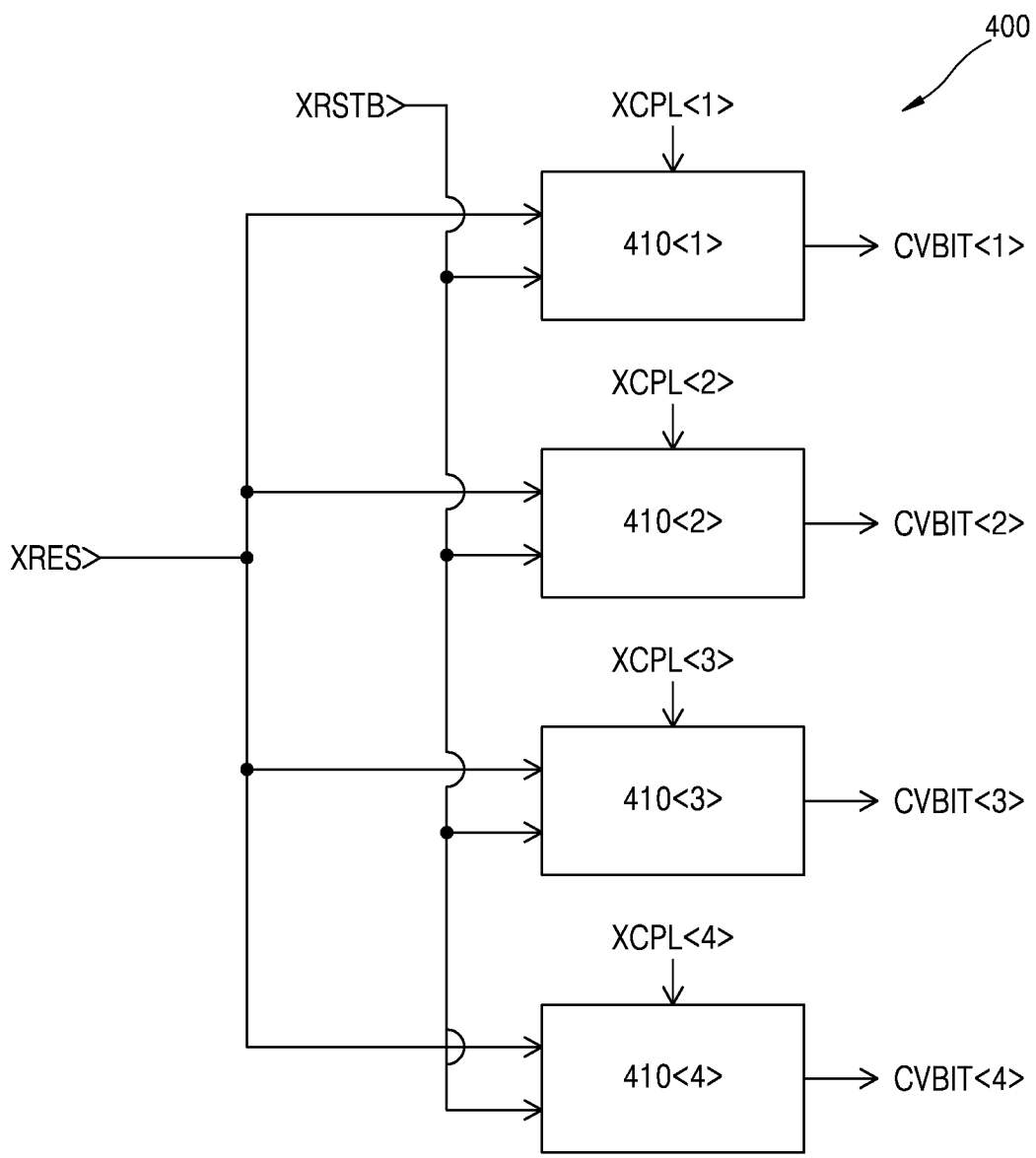
FIG. 7 is a drawing illustrating a code generating part of FIG. 1.

FIG. 7 is a drawing illustrating a code generating part 400 of FIG. 1. Referring to FIG. 7, the code generating part 400 may include 1-st to 4-th code generating units (or 1-st to 4-th code generating parts) 410<1:4> to generate the 1-st to the 4-th conversion digital bits CVBIT<1:4>.

The 1-st to the 4-th code generating units 410<1:4> may be enabled according to the inactivation of "H" of the reset signal XRSTB.

The 1-st conversion digital bit CVBIT<1> may be controlled to the activation state, for example, to the first state of "L," according to the activation of "L" of the reset signal XRSTB. The j-th conversion digital bit CVBIT<j> may be controlled to the inactivation state, for example, to the second state of "H," according to the activation of "L" of the reset signal XRSTB.

Figure 8:
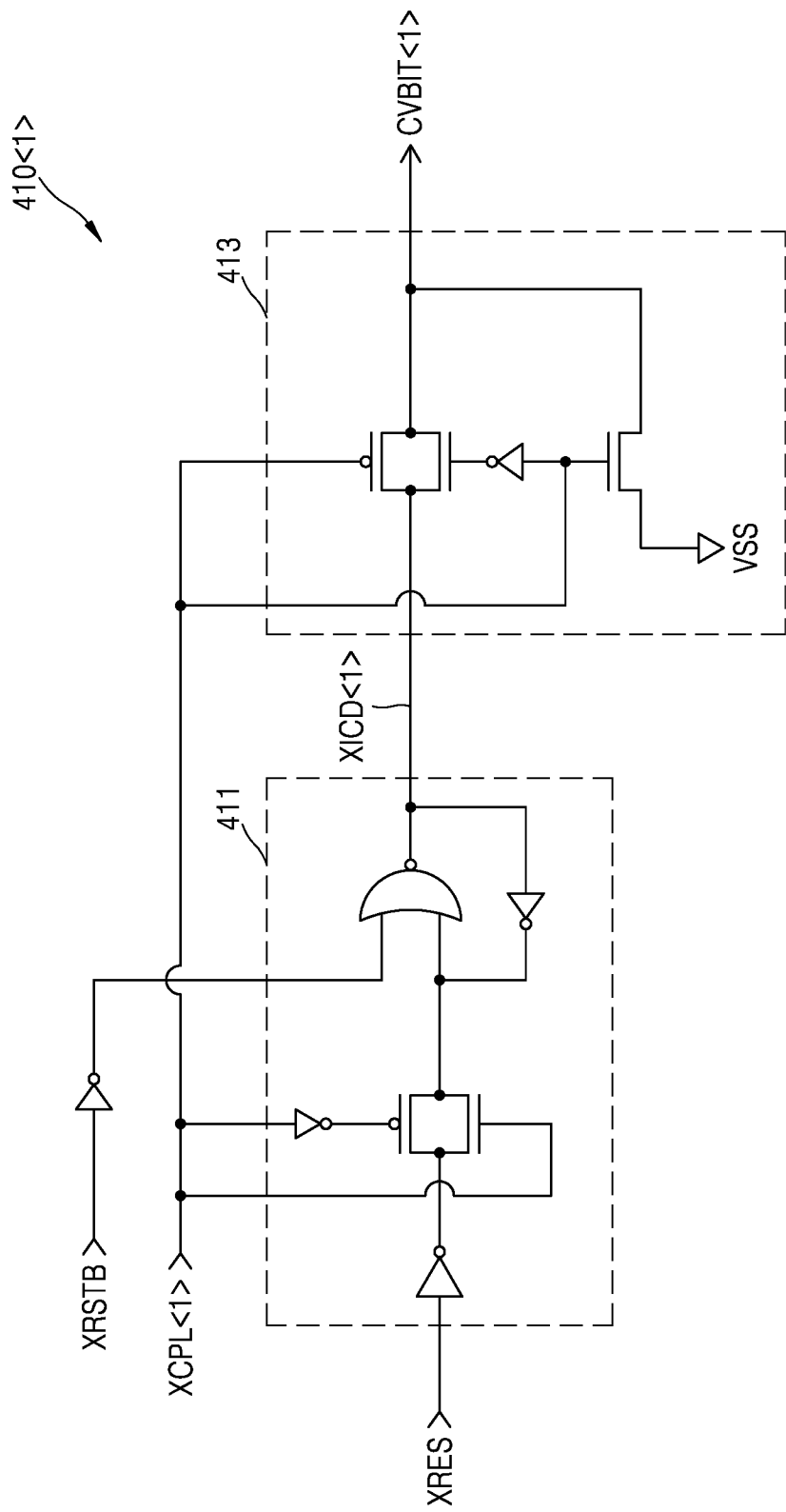
FIG. 8 is a more detailed diagram illustrating a 1-st code generating unit of FIG. 7.

FIG. 8 is a more detailed diagram illustrating the 1-st code generating unit 410<1> of FIG. 7.

Referring to FIG. 8, the 1-st code generating unit 410<1> may include a 1-st input code part 411 and a 1-st output code part 413.

The 1-st input code part 411 may be enabled according to the inactivation of "H" of the reset signal XRSRB. The 1-st input code part 411 may latch the comparison result signal XRES in response to the activation of "H" of the 1-st control pulse signal XCPL<1>, and generate a 1-st input code signal XICD<1>. The 1-st input code signal XICD<1> may have the same logic state as the state of the comparison result signal XRES, and latched to the first logic state of "L" in response to the activation of "L" of the reset signal XRSTB.

The 1-st output code part 413 may generate the 1-st conversion digital bit CVBIT<1> with or by using the 1-st code signal XICD<1> according to the inactivation of "L" of the 1-st control pulse signal XCPL<1>.

According to the 1-st code generating unit 410<1> of FIG. 8 as described above, the 1-st conversion digital bit CVBIT<1> may be controlled to the first logic state of "L" according to the activation of "H" of the 1-st control pulse signal XCPL<1>. The 1-st conversion digital bit CVBIT<1> may be latched to the same logic state as the state of the comparison result signal XRES according to the inactivation of "L" of the 1-st control pulse signal XCPL<1>.

Figure 9:
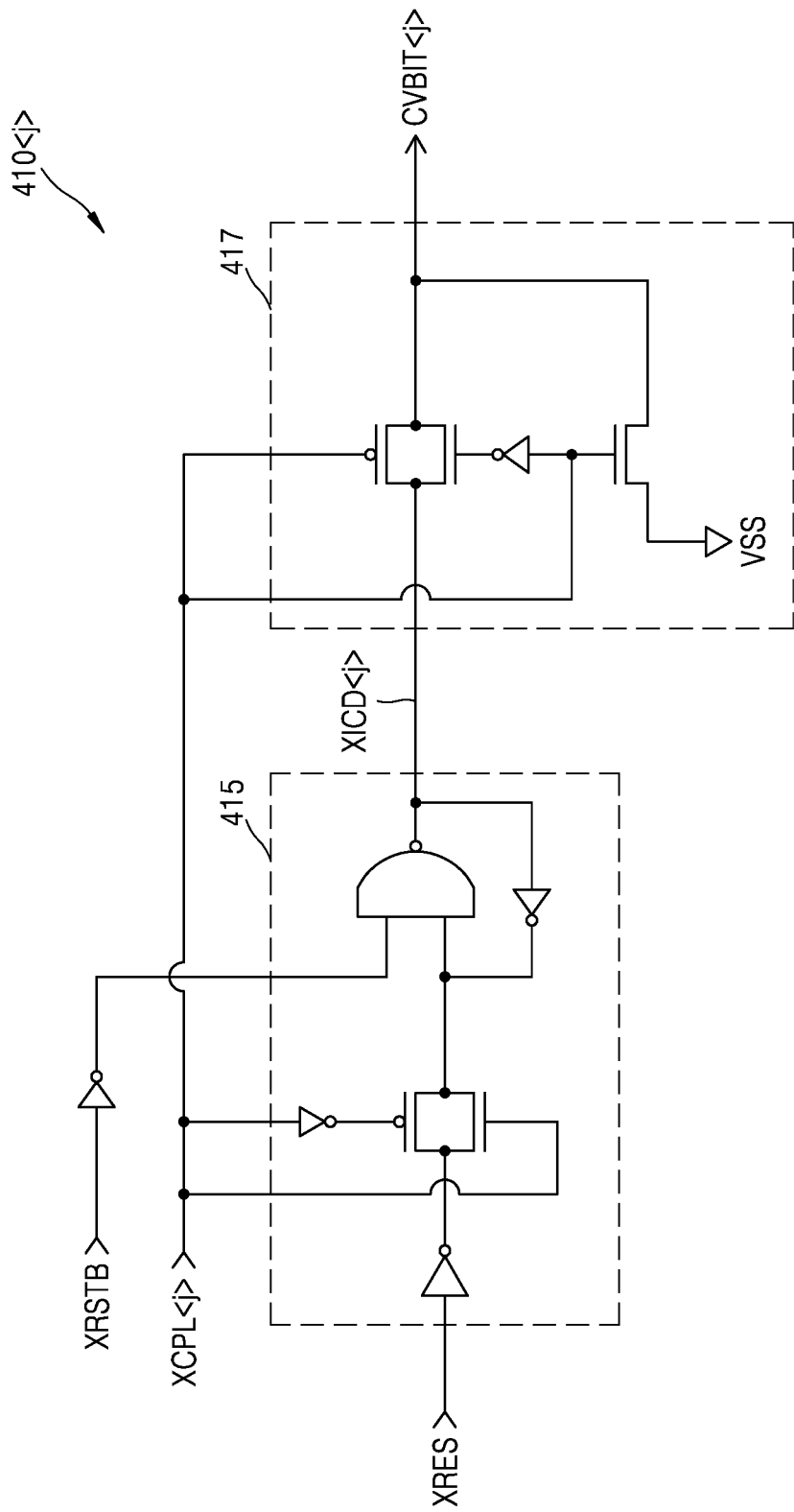
FIG. 9 is a more diagram illustrating any one of a 2-nd to a 4-th code generating unit of FIG. 7.

FIG. 9 is a more detailed diagram illustrating any one of 2-nd to 4-th code generating units 410<2> to 410<4> of FIG.

7. In FIG. 9, a code generating unit 410<j> may be illustrated as an example. Here, 'j' is a natural number in a range of 2 to 4.

Referring to FIG. 9, the code generating unit 410<j> may include a j-th input code part 415 and a j-th output code part 417.

The j-th input code part 415 may be enabled according to the inactivation of "H" of the reset signal XRSRB. The j-th input code part 415 may latch the comparison result signal XRES in response to the activation of "H" of the j-th control pulse signal XCPL<j>, and generate a j-th input code signal XICD<j>. The j-th input code signal XICD<j> may have the same logic state as the state of the comparison result signal XRES, and may be latched to the second logic state of "H" in response to the activation of "L" of the reset signal XRSTB.

The j-th output code part 417 may generate the j-th conversion digital bit CVBIT<j> with using the j-th code signal XICD<j> according to the inactivation of "L" of the j-th control pulse signal XCPL<j>.

According to the j-th code generating unit 410<j> of FIG. 9 as described above, the j-th conversion digital bit CVBIT<j> may be controlled to the first logic state of "L" according to the activation of "H" of the j-th control pulse signal XCPL<j>. The j-th conversion digital bit CVBIT<j> may be latched to the same logic state as the state of the comparison result signal XRES according to the inactivation of "L" of the j-th control pulse signal XCPL<j>.

As a result, according to the j-th code generating part 400 of FIG. 7 as described above, in response to the activation of "L" of the reset signal XRSTB, the initial logic states of the 1-st to the 4-th conversion digital bits CVBIT<1:4> may be set. In other word, in response to the activation of "L" of the reset signal XRSTB, the 1-st conversion digital bit CVBIT<1> may be controlled to the first logic state of "L," and the 2-nd to the 4-th conversion digital bits CVBIT<2:4> may be controlled to the second logic state of "H." Refer to t11 in FIG. 10.

According to the activation of the corresponding 1-st to 4-th control pulse signals XCPL<1:4>, each of the 1-st to the 4-th conversion digital bits CVBIT<1:4> may be controlled to the first logic state of "L." According to the inactivation of the corresponding 1-st to 4-th control pulse signals XCPL<1:4>, each of the 1-st to the 4-th conversion digital bit CVBIT<1:4> may be controlled to the same logic state as the state of the comparison result signal XRES. Refer to t31, t32, t33 and t34 in FIG.

Subsequently, with reference to FIG. 11, in the analog-to-digital converter of the disclosure, the decision process of the 1-st to the 4-th conversion digital bits CVBIT<1:4> in the conversion digital code DGCV is described.

Figure 11:
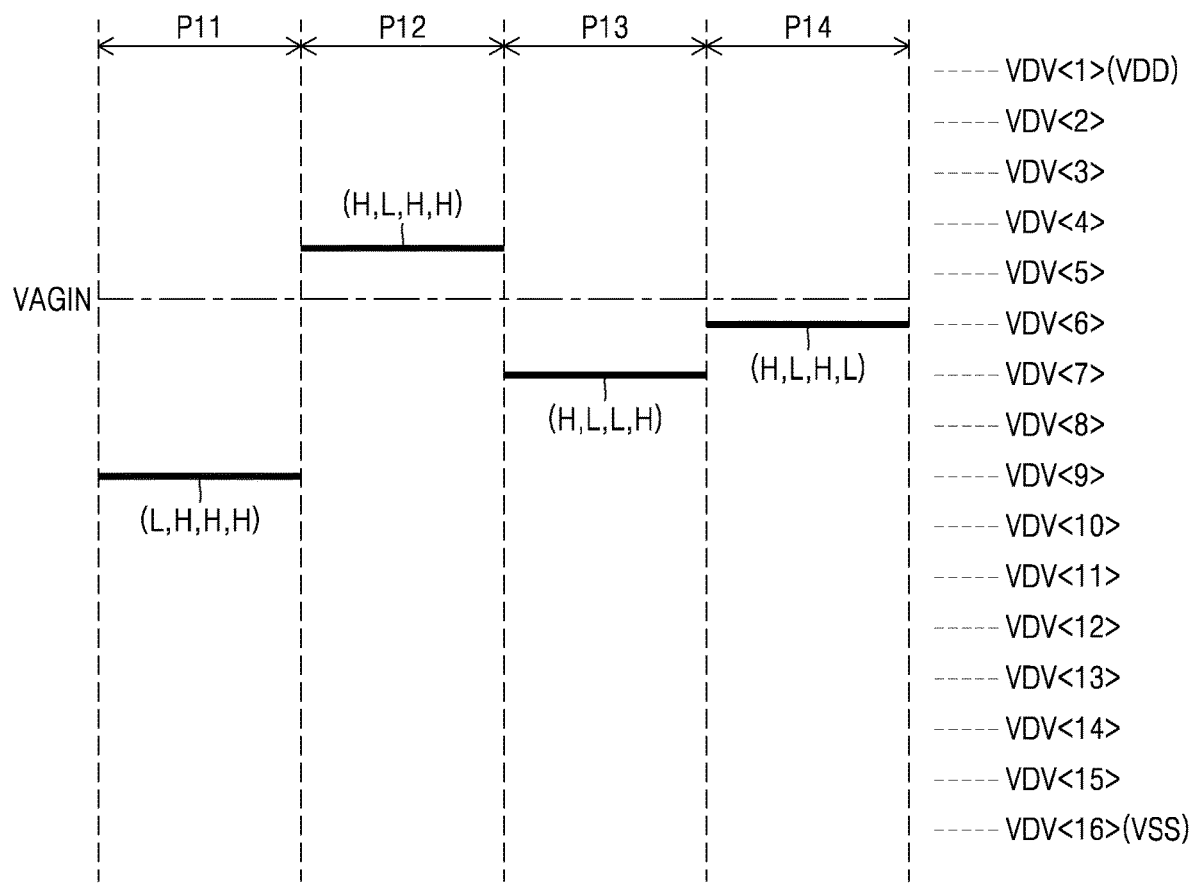
FIG. 11 is a diagram for explaining a method of determining a conversion digital code in the analog-to-digital converter of FIG. 1.

In FIG. 11, the 1-st to the 4-th control pulse signals XCPL<1:4> may be activated as "H" in sections P11 to P14, respectively. In FIG. 11, it is assumed that the input analog voltage VAGIN is a level between a 5-th division voltage VDV<5> and a 6-th division voltage VDV<6>.

First, in the section P11, the bit value of the 1-st conversion digital bit CVBIT<1> may be "L," and the bit values of the 2-nd to the 4-th conversion digital bits CVBIT<2:4> may be "H." The conversion code voltage VCOD may be controlled to be a 9-th division voltage VDV<9>, which may be close to an intermediate level between the 1-st division voltage VDV<1> and the 16-th division voltage VDV<16>.

In this case, since the input analog voltage VAGIN is at a higher level than the conversion code voltage VCOD, the bit value of the 1-st conversion digital bit CVBIT<1> may be determined as ""H" and latched.

In the section P12, the bit value of the 1-st conversion digital bit CVBIT<1> may be "H," which may be previously determined. The bit value of the 2-nd conversion digital bit CVBIT<2> may be "L," and the bit values of a 3-rd and the 4-th conversion digital bit CVBIT<3> and CVBIT<4>"H."

The conversion code voltage VCOD may be controlled to be the 5-th division voltage VDV<5>, which may be close to an intermediate level between the 1-st division voltage VDV<1> and the 9-th division voltage VDV<9>.

In this case, since the input analog voltage VAGIN is at a lower level than the conversion code voltage VCOD, the bit value of the 2-nd conversion digital bit CVBIT<2> may be determined as "L" and latched.

In the section P13, the bit value of the 1-st conversion digital bit CVBIT<1> and the bit value of the 2-nd conversion digital bit CVBIT<2> may be "H" and "L," respectively, which may be previously determined. The bit value of the 3-rd conversion digital bit CVBIT<3> may be "L," and the bit value of the 4-th conversion digital bit CVBIT<4> may be "H."

The conversion code voltage VCOD may be controlled to be the 7-th division voltage VDV<5>, which is close to an intermediate level between the 5-th division voltage VDV<5> and the 9-th division voltage VDV<9>.

In this case, since the input analog voltage VAGIN is at a higher level than the conversion code voltage VCOD, the bit value of the 3-rd conversion digital bit CVBIT<3> may be determined as "H" and latched.

In the section P14, the bit value of the 1-st conversion digital bit CVBIT<1>, the bit value of the 2-nd conversion digital bit CVBIT<2> and the bit value of the 3-rd conversion digital bit CVBIT<3> may be "H," "L" and "H," respectively, which may be previously determined. The bit value of the 4-th conversion digital bit CVBIT<4>"L."

The conversion code voltage VCOD may be controlled to be the 6-th division voltage VDV<6>, which may be close to an intermediate level between the 5-th division voltage VDV<5> and the 7-th division voltage VDV<7>.

In this case, since the input analog voltage VAGIN is at a higher level than the conversion code voltage VCOD, the bit value of the 4-th conversion digital bit CVBIT<4> may be determined as "H" and latched.

By the above process, bit values of the 1-st to the 4-th conversion digital bit CVBIT<1> to CVBIT<4> in the conversion digital code DGCV may be determined as "H," "L," "H" and "H." For example, the number of clocks of the clock signal CLK required to determine the conversion digital code DGCV may be "4."

As a result, according to the analog-to-digital converter of the disclosure as described above, it is possible to quickly convert the input analog voltage VAGIN into the conversion digital code DGCV, even in the worst case.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An analog-to-digital converter that converts an input analog voltage into a conversion digital code, the analog-to-digital converter comprising:
   a code voltage generating part that generates a conversion code voltage according to the conversion digital code, wherein
   the conversion code voltage is an analog type voltage,
   the conversion digital code is consisted of a 1-st to a n-th conversion digital bits,
   the 1-st to the n-th conversion digital bits are in order from a most significant bit to a least significant bit, and
   "n" is a natural number equal to or greater than 2;
   a voltage comparing part that generates a comparison result signal by comparing the input analog voltage and the conversion code voltage, a logic state of the comparison result signal being based on the result of the comparison of the input analog voltage and the conversion code voltage;
   a shifting register that receives a clock signal and generates a 1-st to a n-th control pulse signals, the 1-st to the n-th control pulse signals being sequentially activated without overlapping; and
   a code generating part that generates the conversion digital code by receiving the comparison result signal and the 1-st to the n-th control pulse signals, a logic state of the i-th conversion digital bit being based on a logic state of the comparison result signal during an activation of an i-th control pulse signal, and "i" being a natural number in a range of 1 to n.

2. The analog-to-digital converter of claim 1, wherein
   the 1-st conversion digital bit is controlled to a first logic state according to an activation of a reset signal, and
   the 2-nd to n-th conversion digital bits are controlled to a second logic state according to an activation of the reset signal, the second logic state being opposite to the first logic state.

3. The analog-to-digital converter of claim 1, wherein the code voltage generating part includes:
   a resistor string that generates 1-st to p-th division voltages, wherein
   the 1-st to p-th division voltages are obtained by dividing a voltage difference between a power voltage and a ground voltage with a 1-st to a (p-1)-th division voltage resistors formed in series between the power voltage and the ground voltage, and
   p is 2 to the power of n; and
   a selection part that generates the conversion code voltage, the conversion code voltage being controlled to the same level as any one of the 1-st to the p-th division voltages selected according to the conversion digital code.

4. The analog-to-digital converter of claim 1, wherein
   the comparison result signal is controlled to a first logic state as the input analog voltage is lower than the conversion code voltage, and
   the comparison result signal is controlled to a second logic state as the input analog voltage is higher than the conversion code voltage, the second logic state being opposite to first logic state.

5. The analog-to-digital converter of claim 1, wherein
   the 1-st control pulse signal is controlled to an activated state according to an activation of a reset signal, and
   the 2-nd to n-th control pulse signals are controlled to an inactivated state according to an inactivation of the reset signal.

6. The analog-to-digital converter of claim 5, wherein
   the shifting register includes 1-st to n-th flip-flops that generates the 1-st to the n-th control pulse signals,
   the 1-st flip-flop is enabled according to an inactivation of the reset signal, latches a ground voltage according to an inactivation of the clock signal, and controls the 1-st control pulse signal to a logic state of the latched ground voltage according to an inactivation of the clock signal, and
   the j-th flip-flop is enabled according to an inactivation of the reset signal, latches a (j-1)-th control pulse signal according to an activation of the clock signal, and controls the j-th control pulse signal to a logic state of (j-1)-th control pulse signal according to an inactivation of the clock signal, "j" being a natural number in a range of 2 to n.

7. The analog-to-digital converter of claim 5, wherein the 1-st flip-flop includes:
   a 1-st input flop part that is enabled according to an inactivation of the reset signal, receives a ground voltage, and generates a 1-st input flop signal, the 1-st input flop signal being latched to a logic state opposite to a state of the ground voltage in response to an activation of the clock signal and being latched to the first logic state in response to an activation of the reset signal; and
   a 1-st output flop part that is enabled according to an inactivation of the reset signal, receives the 1-st input flop signal, and generates the 1-st control pulse signal, the 1-st control pulse signal being latched to a logic state opposite to a state of the 1-st input flop signal in response to an inactivation of the clock signal and being latched to the second logic state in response to an activation of the reset signal.

8. The analog-to-digital converter of claim 7, wherein the j-th flip-flop includes:
   a j-th input flop part that is enabled according to an inactivation of the reset signal, receives the (j-1)-th control pulse signal, and generates a j-th input flop signal, the j-th input flop signal being latched to a logic state opposite to a state of the (j-1)-th control pulse signal in response to an activation of the clock signal and being latched to the second logic state in response to an activation of the reset signal; and
   a j-th output flop part that is enabled according to an inactivation of the reset signal, receives the j-th input flop signal, and generates the j-th control pulse signal, the j-th control pulse signal being latched to a logic state opposite to a state of the j-th input flop signal in response to an inactivation of the clock signal and being latched to the first logic state in response to an activation of the reset signal.

9. The analog-to-digital converter of claim 5, wherein
   the 1-st conversion digital bit is controlled to a first logic state according to an activation of a reset signal, and
   the 2-nd to n-th conversion digital bits are controlled to a second logic state according to an activation of the reset signal, the second logic state being opposite to the first logic state.

10. The analog-to-digital converter of claim 9, wherein the i-th conversion digital bit is controlled to the first logic state according to an activation of the reset signal, and controlled to the logic state based on the logic state of the comparison result signal according to an inactivation of the j-th control pulse signal.

11. The analog-to-digital converter of claim 9, wherein the code generating part includes 1-st to n-th code generating parts that generate 1-st to n-th conversion digital bits, respectively.

12. The analog-to-digital converter of claim 11, wherein the 1-st code generating part includes:
- a 1-st input code part that is enabled according to an inactivation of the reset signal, latches the comparison result signal in response to an activation of the 1-st control pulse signal, and generates a 1-st input code signal, the 1-st input code signal having the same logic state as the comparison result signal and being controlled to the first logic state in response to an activation of the reset signal; and
- a 1-st output code part that generates the 1-st conversion digital bit by using the 1-st code signal according to an inactivation of the 1-st control pulse signal.

13. The analog-to-digital converter of claim 12, wherein the j-th code generating part includes:
- a j-th input code part that is enabled according to an inactivation of the reset signal, latches the comparison result signal in response to an activation of a j-th control pulse signal, and generates a j-th input code signal, the j-th input code signal having the same logic state as the comparison result signal and being controlled to the second logic state in response to an activation of the clock signal; and
- a j-th output code part that generates a j-th conversion digital bit by using a j-th code signal according to an inactivation of the j-th control pulse signal, j being a natural number in a range of 2 to n.

14. The analog-to-digital converter of claim 1, wherein the voltage comparing part further includes:
- a comparing part that generates a comparison preliminary signal by receiving the comparison result signal and the 1-st to the n-th control pulse signals, and
- a buffering part that generates the comparison result signal by receiving the comparison preliminary signal.

\* \* \* \* \*